(12) United States Patent
Blednov

(10) Patent No.: US 7,898,338 B2
(45) Date of Patent: Mar. 1, 2011

(54) HIGH POWER INTEGRATED RF AMPLIFIER

(75) Inventor: Igor Blednov, Nijmegen (NL)

(73) Assignee: NXP B.V., Eindhoven (NL)

( * ) Notice: Subject to any disclaimer, the term of this patent is extended or adjusted under 35 U.S.C. 154(b) by 225 days.

(21) Appl. No.: 12/298,735

(22) PCT Filed: Apr. 24, 2007

(86) PCT No.: PCT/IB2007/051492
§ 371 (c)(1),
(2), (4) Date: Oct. 27, 2008

(87) PCT Pub. No.: WO2007/122586
PCT Pub. Date: Nov. 1, 2007

(65) Prior Publication Data
US 2009/0174482 A1 Jul. 9, 2009

(30) Foreign Application Priority Data
Apr. 26, 2006 (EP) .................................... 06113148

(51) Int. Cl.
*H03F 3/68* (2006.01)
(52) U.S. Cl. ......................................... 330/295; 330/307
(58) Field of Classification Search ................... 330/295, 330/124 R, 307, 84, 126
See application file for complete search history.

(56) References Cited

U.S. PATENT DOCUMENTS

| | | | | |
|---|---|---|---|---|
| 5,057,712 | A * | 10/1991 | Trinh et al. | 326/86 |
| 6,218,856 | B1 * | 4/2001 | Sasaki | 326/39 |
| 6,362,649 | B1 * | 3/2002 | McGowan | 326/41 |
| 6,580,631 | B1 * | 6/2003 | Keeth et al. | 365/143 |
| 7,005,748 | B2 * | 2/2006 | Kim et al. | 257/778 |
| 2004/0061214 | A1 | 4/2004 | Crescenzi, Jr. | |

FOREIGN PATENT DOCUMENTS

| | | |
|---|---|---|
| EP | 0 704 965 A1 | 4/1996 |
| WO | 00/60664 A1 | 10/2000 |
| WO | 2004/0017512 A1 | 2/2004 |
| WO | 2006/003608 A1 | 1/2006 |
| WO | 2006/006119 A1 | 1/2006 |
| WO | 2006/016299 A1 | 2/2006 |

OTHER PUBLICATIONS

Doherty, W.H.; "A New High-Efficiency Power Amplifier For Modulated Waves"; Bell Telephone System Technical Publications; Cleveland, OH, US; May 1936.
International Search Report for International Patent Appln. No. PCT/IB2007/051492 (Jul. 28, 2009).
International Preliminary Report on Patentability for International Patent Appln. No. PCT/IB2007/051492 (Aug. 11, 2009).

* cited by examiner

*Primary Examiner* — Henry K Choe

(57) ABSTRACT

An integrated HF-amplifier has an input bond pad, cells displaced in a first direction, and an output bond pad. Each has a amplifier with input pad, active area, and output pad. The active area is arranged in-between the input and output pads, and the input pad, active area, and output pad are respectively displaced in a second direction substantially perpendicular to the first direction. A first network interconnects input pads of adjacent cells, and extends in the first direction. A second network interconnects output pads of adjacent cells, and extends in the first direction. The first and second networks obtain an output signal at the output bond pad having for all interconnected cells an equal phase shift and amplitude for a same input signal at the input bond pad. At particular bias and phase shift conditions this provides a Doherty amplifier with improved efficiency at power back off.

15 Claims, 12 Drawing Sheets

HIGH POWER INTEGRATED RF AMPLIFIER

The invention relates to an integrated RF-amplifier structure, and an integrated circuit comprising such an integrated amplifier structure.

Figure 1:
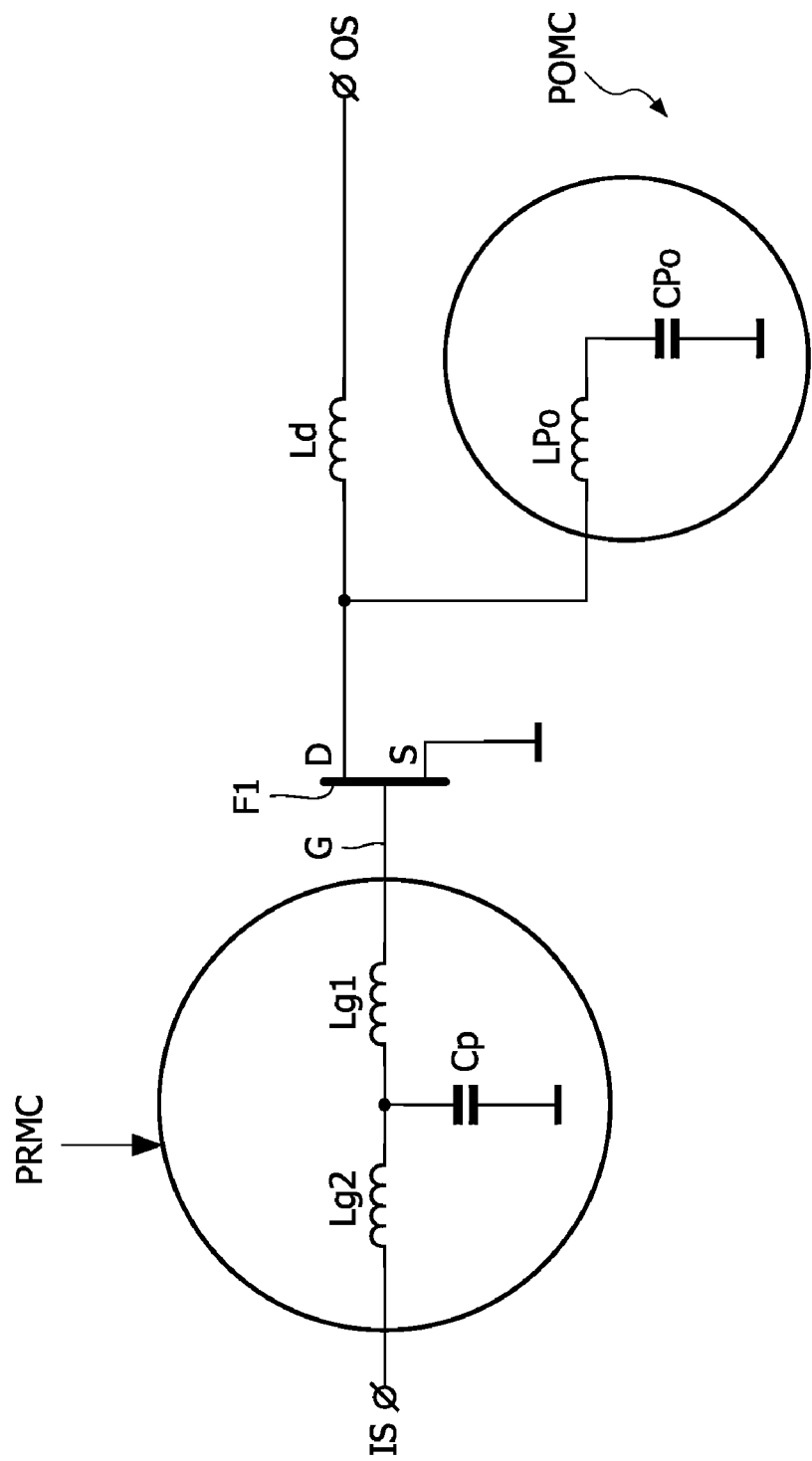
Figure 2:
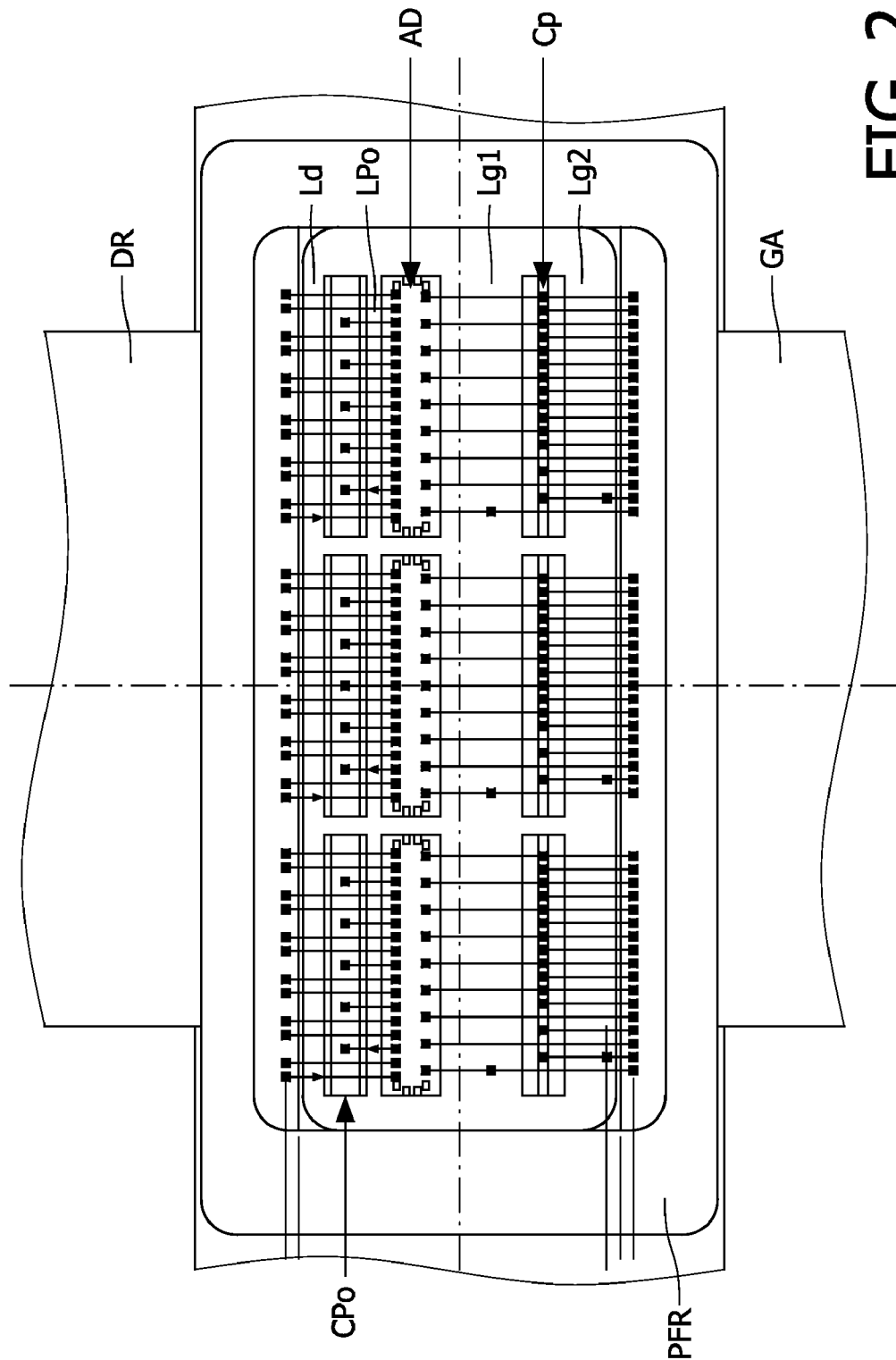

In wireless communication, especially in base stations, very high power RF-amplifiers are required. Recent integrated RF-power amplifiers are able to achieve up to 180 W output peak power, but this is still insufficient. These RF-amplifiers are for example used in 3G wireless communication or W-CDMA. A typical example of a modern design RF-amplifier in a SOT502 package is shown in FIG. 2, the corresponding electrical diagram for one basic amplifier cell is shown in FIG. 1. The active dies are arranged in a row in-between pre-matching and post-matching circuits. The dies comprise a plurality of basic amplifier cells, which are driven in parallel. The aligned row arrangement of the dies is essential because the delay times from input to output should be identical for all amplifier cells. Especially the delays or phase shifts caused by the pre- and post matching circuits should be identical for each amplifier cell. As is clear from FIG. 2, the number of amplifier cells in a row is limited by the package width, and the active dies only cover a small portion of the area available within the package. This limits the maximum output power of the device and the removal of heat caused by power dissipated on active area of the device.

It is an object of the invention to provide an integrated RF-amplifier structure in which the total area of the active dies is larger in a same package.

A first aspect of the invention provides an integrated RF-amplifier structure as claimed in claim 1. A second aspect of the invention provides an integrated circuit as claimed in claim 14. Advantageous embodiments are defined in the dependent claims.

An integrated RF-amplifier structure in accordance with the first aspect of the invention comprises in a first direction, from input to output of the device package and in the following order: an input bond pad, a plurality of cells being displaced with respect to each other in the first direction, and an output bond pad. The cells, which also are referred to as amplifier cells comprise at least an amplifier with an input pad to receive an input signal and an output pad to supply an output signal, which is an amplified version of the input signal. The cells may comprise a single transistor, preferably a FET, or a plurality of transistors, which form the amplifier. The cells may comprise further lumped elements such as capacitors and inductors, which form or are part of the matching networks.

If the cells comprise a single transistor, the active area of the transistor is arranged between an input pad and an output pad. Usually, the active area is the so called finger structure of alternating interleaving gate and drain fingers which are interconnected at the gate pad which is the input pad and drain pad which is the output pad, respectively. The input pad, the active area, and the output pad are displaced with respect to each other in a second direction substantially perpendicular to the first direction. Thus, the active area of the amplifier is present between the input and output pads and extends in the first direction which means that the fingers, which extent in the second direction, alternate in the first direction.

The RF-amplifier comprises a plurality of cells between the input and output bond pads. The cells are displaced with respect to each other along a direction of a line connecting corresponding input and output bond pads.

A first network comprises first interconnecting means to interconnect the input pads of adjacent ones of the plurality of cells. A second network comprises second interconnecting means to interconnect the output pads of adjacent ones of the plurality of cells. With adjacent ones is meant adjacent in the first direction. The first network and the second network are designed to obtain an output signal at the output bond pad, which has for all interconnected amplifier cells an equal phase shift and amplitude for the same input signal at the input bond pad.

Due to the orientation and position of the amplifiers such that the input pad, the active area, and the output pad are displaced in the second direction while the first and second interconnection means are extending in the first direction perpendicular to the second direction it is easily possible to obtain the same phase shifts between inputs and outputs. This is especially true if the position of the input pad and the output pad in the first direction with respect to the active area is the same and is the same for all cells. If two amplifier cells are arranged in-between the input and output bond pads, the amount of amplifiers which fits in the package is doubled and thus also the possible output power level.

In an embodiment as claimed in claim 2, the first interconnecting means comprises a first bond wire, which extends in the first direction, and the second interconnecting means comprises a second bond wire, which also extends in the first direction. The use of bond wires enables to provide an inductance without wasting chip area. Additionally, the height of bond pads is easily adjustable to obtain a correct matching impedance and an identical phase shift. Usually, in practical implementations, a FET has an output capacitance, which is smaller than the input capacitance. The difference in inductance required is obtained by implementing bond wires having different heights. These different heights are advantageous because the parallel arranged bond wires between the input pads and the output pads of the interconnected cells have a minimal electro-magnetic coupling.

In an embodiment as claimed in claim 4, each one of the amplifier cells is arranged on a separate die. Thus now, at least two dies are arranged between the input and output bond pads. Whether separate dies are required depends on the frequency band the RF amplifier is used for. At high frequencies, the required length of the bond wires between the adjacent cells can be short, for example, less than 1.5 mm, and both amplifier cells can be arranged on one single die. At lower frequencies, the required length of the interconnecting bond wires is longer and the distance between two cells becomes relatively large. Consequently, it would be a waste of silicium to arrange both cells on one die.

In an embodiment as claimed in claim 6, the first bond wire directly interconnects input pads of the adjacent cells. This is a simple embodiment wherein only an inductance is present in-between input pads of adjacent cells.

In an embodiment as claimed in claim 7, the second bond wire directly interconnects output pads of the adjacent cells. This is a simple embodiment wherein only an inductance is present in-between output pads of adjacent cells.

In an embodiment as claimed in claim 8, the first network further comprises a capacitor, which is arranged in series with the first bond wire. The series arrangement is arranged between the input pads of the adjacent cells, and the input signal is supplied to one of the input pads.

In an embodiment as claimed in claim 9, the first network further comprises a series arrangement of a capacitor and the first bond wire. The series arrangement is arranged between the input pads of the adjacent cells. The capacitor is arranged such that the input signal is supplied via the capacitor to the input pads.

In an embodiment as claimed in claim 10, a series arrangement of an inductor and a capacitor is connected between each one of the input pads and ground. These series arrangements partially compensate for the input capacitances of the cells and thus allow to tailor the input impedance of the amplifiers. If the cells comprise a single FET, the input capacitance is the gate-source capacitance.

In an embodiment as claimed in claim 11, a series arrangement of an inductor and a capacitor is connected to each one of the output pads. These series arrangements partially compensate for the output capacitances of the cells. If the cells comprise a single FET, the output capacitance is the drain-source capacitance.

In an embodiment as claimed in claim 13, at each position in the first direction, the cell is replaced by a row of cells to obtain in the order mentioned in the second direction: a row of input bond pads, a plurality of rows of cells being displaced with respect to each other in the first direction, and a row of output bond pads, wherein all the rows are arranged in parallel with each other. Now, at each position in the first direction a row of cells is present. This row of cells may be integrated on a single active die, but may also be separated in a plurality of dies. Instead of a single row of dies as known from the prior art shown in FIG. 1, now at least two rows of dies are provided in the same package and thus the power capability has been increased enormously.

In an embodiment as claimed in claim 15, the plurality of cells comprises a first cell and a second cell. The first network and the second network provide a phase shift of +90° or −90°, respectively, at a particular operational frequency. The amplifier of the second cell is set to operate in class B or C. If the amplifier is a FET, the gate bias voltage is selected to obtain this class B or C operation. In this manner a Doherty Amplifier is obtained which has an improved efficiency at power back-off level.

Doherty amplifiers are well known from the publication "A new high-efficiency power amplifier for modulated waves" by W. H. Doherty, in Bell Telephone System technical publications, presented at the annual convention of the institute of radio engineers, Cleveland, Ohio, May, 1936. Doherty discloses a linear power amplifier for amplifying a modulated high-frequent carrier signal with a high efficiency. The high efficiency is obtained by using two tubes, which form a basic amplifier structure. In one embodiment, a first tube (called tube 2 in FIG. 9b of this publication) receives directly the input signal of the basic amplifier structure and has an output directly connected to the output of the basic amplifier structure. The second tube (called tube 1 in FIG. 9b of this publication) receives the input signal of the basic amplifier structure via a +90 degrees phase shift network and has an output connected via a −90° phase shift network to the output of the basic amplifier structure.

The first tube is biased for operation in class C and does not conduct any current at low power level. The first tube starts conducting current at a power level, which is about 6 dB below maximum power level of the basic amplifier structure, so that at the peak of modulation the required additional power output is obtained from this tube. The second tube, which is biased for AB-class operation behaves like a conventional linear amplifier from zero excitation until the carrier level. The first tube comes into play as the instantaneous excitation increases beyond the carrier level. That is why in modern literature the first tube (nowadays: first transistor) is referred to as the peak amplifier of the Doherty amplifier, and the second tube (nowadays: second transistor) is referred to as the carrier or main amplifier of the Doherty amplifier.

These and other aspects of the invention are apparent from and will be elucidated with reference to the embodiments described hereinafter.

In the drawings:

FIG. 1 shows a circuit diagram of a cell of a prior art RF-amplifier shown in FIG. 2.

Figure 3:
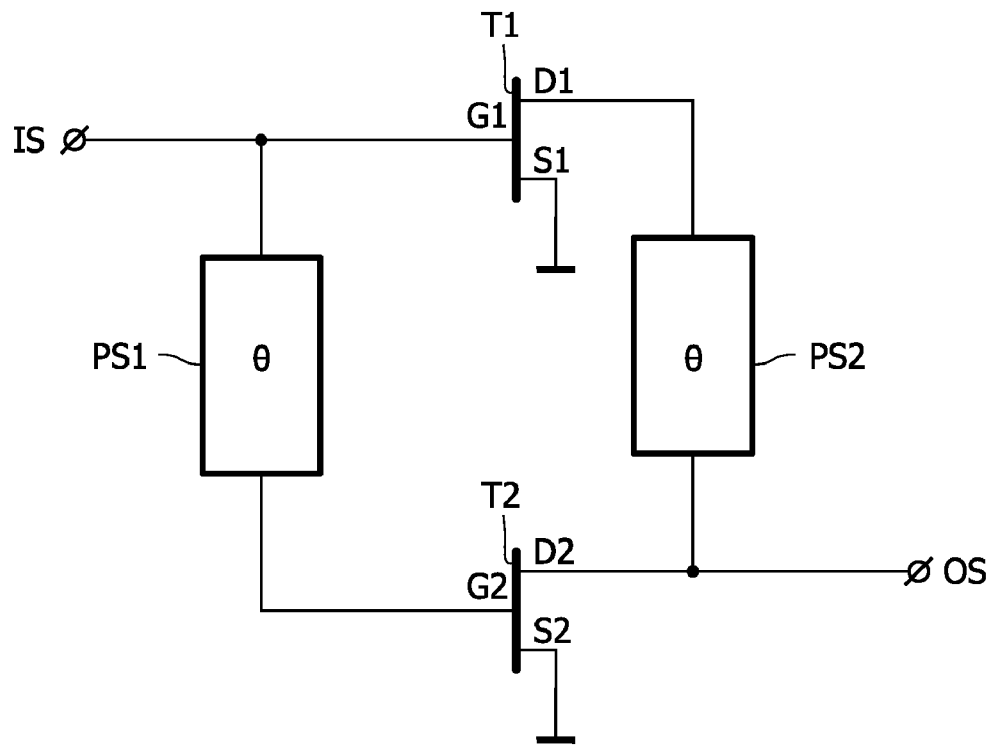
Figure 4A:
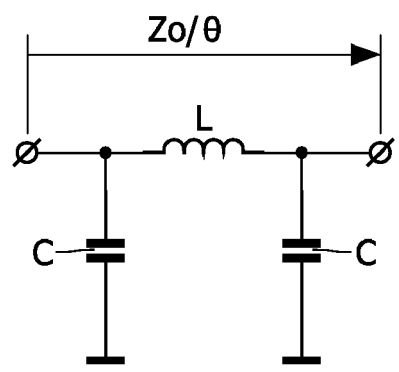
Figure 4B:
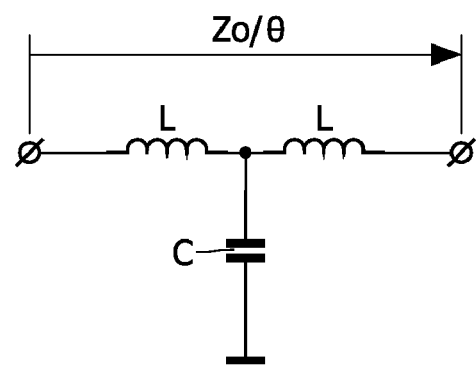
Figure 5:
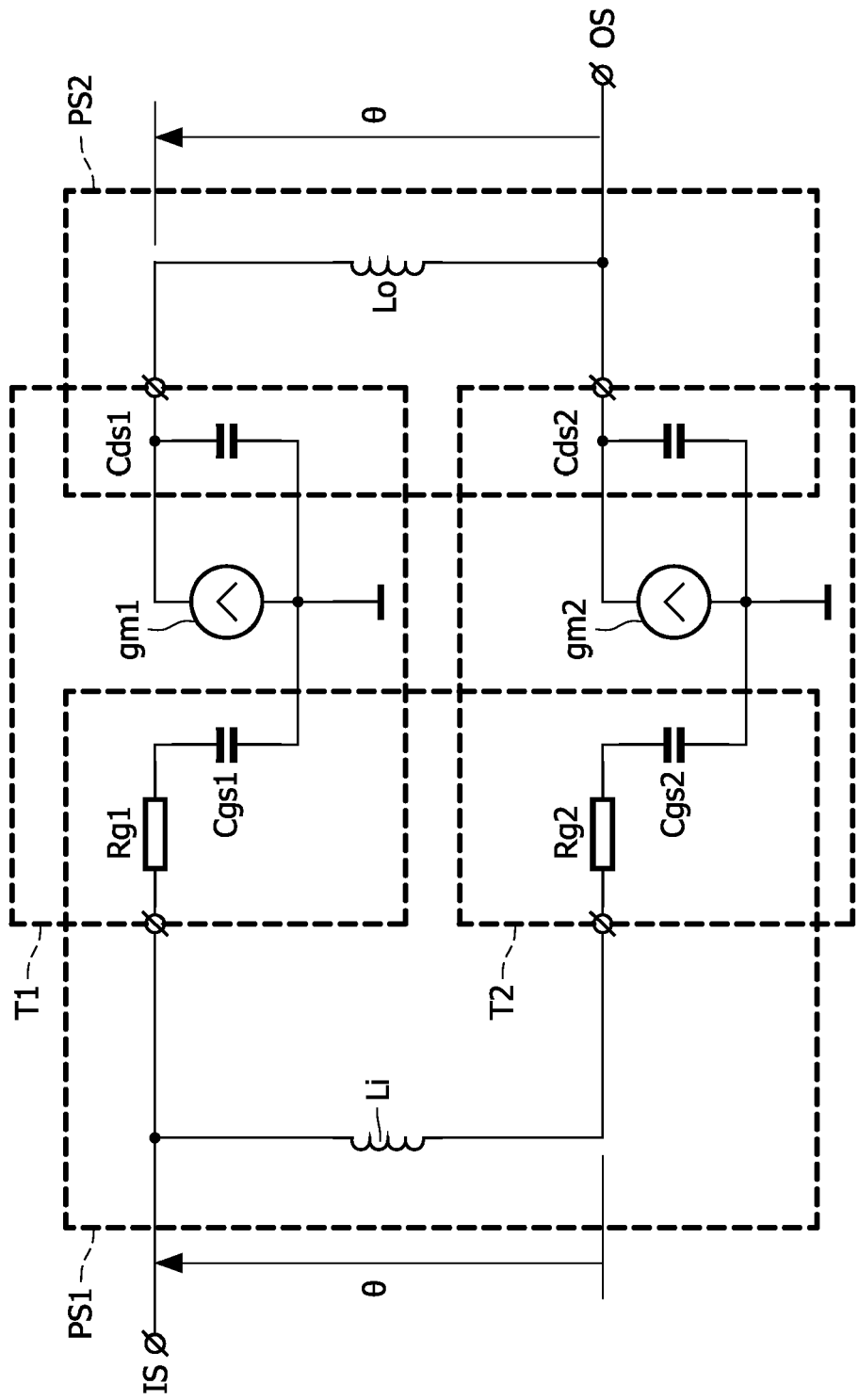
Figure 6:
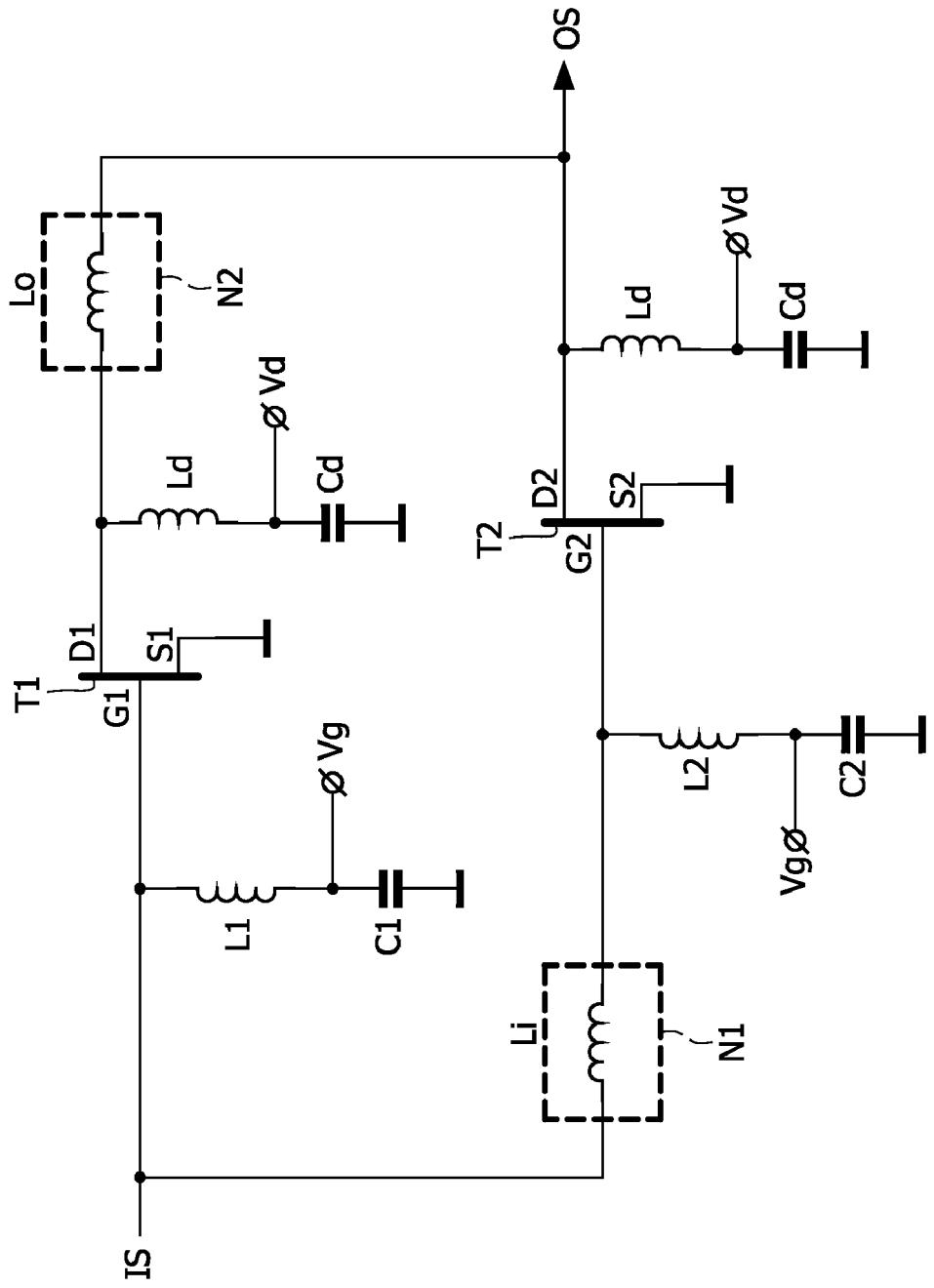
Figure 7:
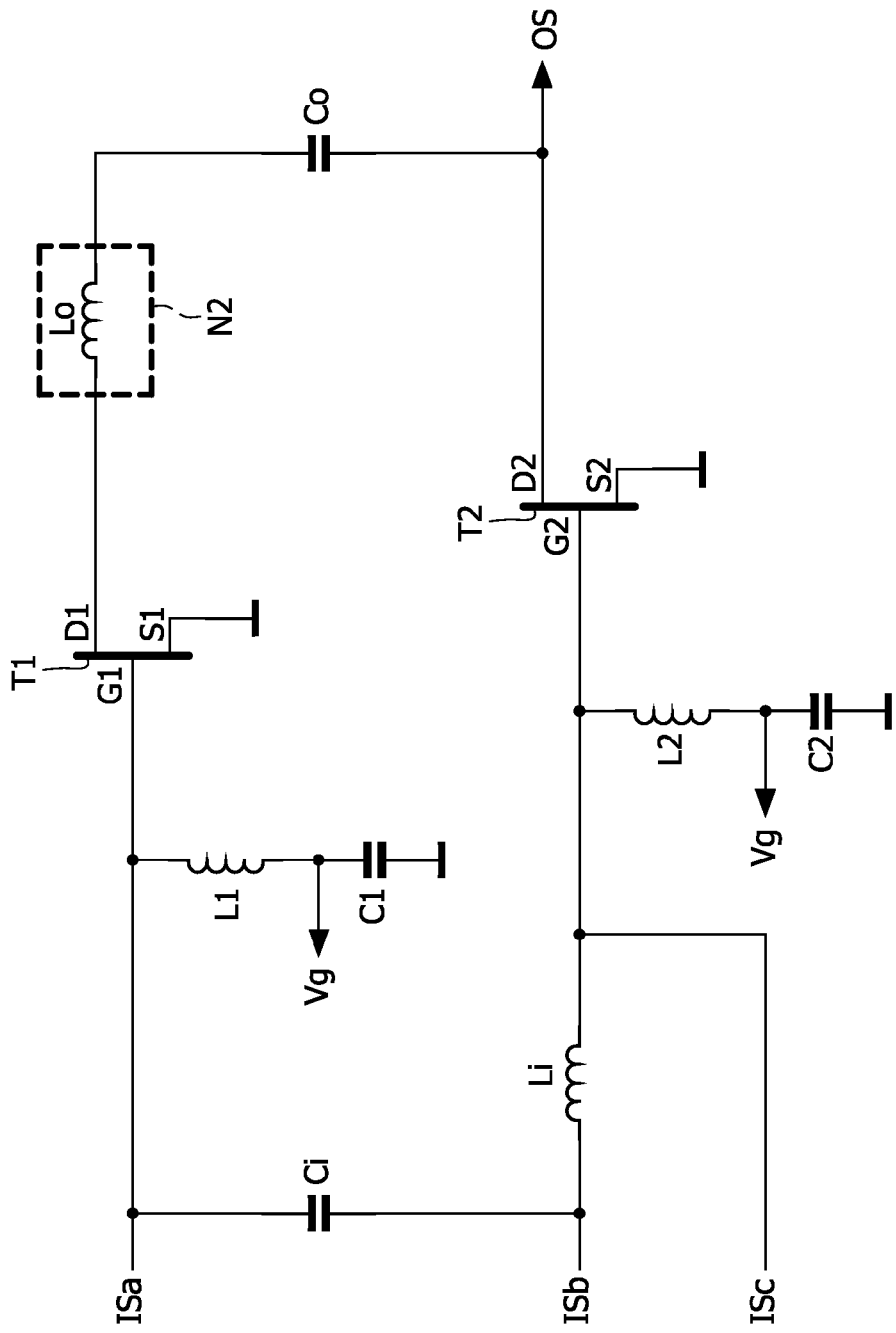
Figure 8:
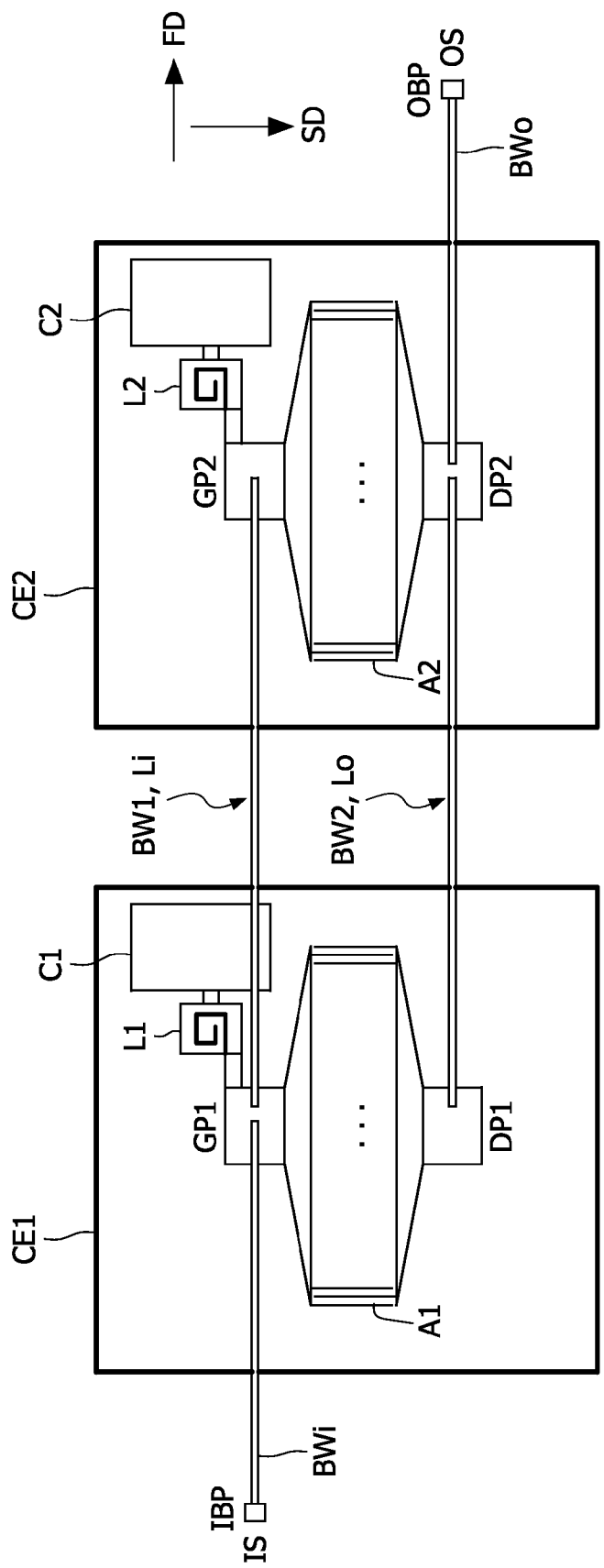
Figure 9:
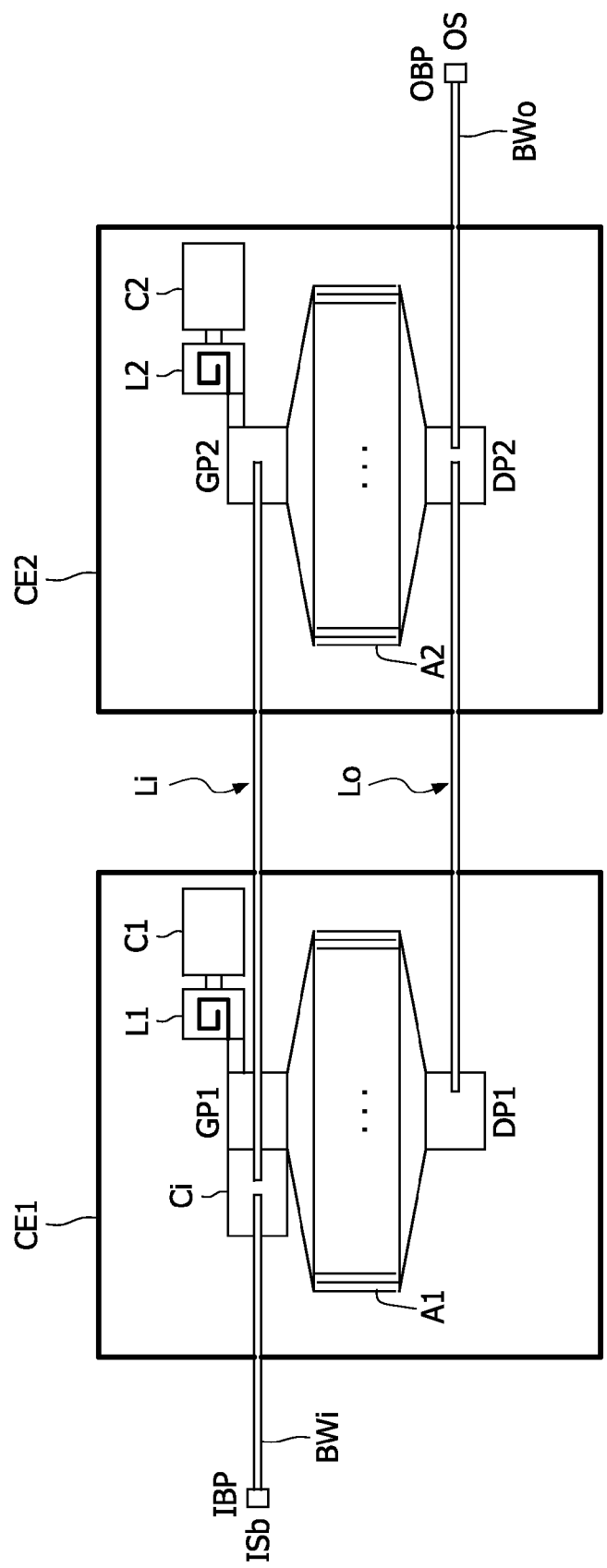
Figure 10:
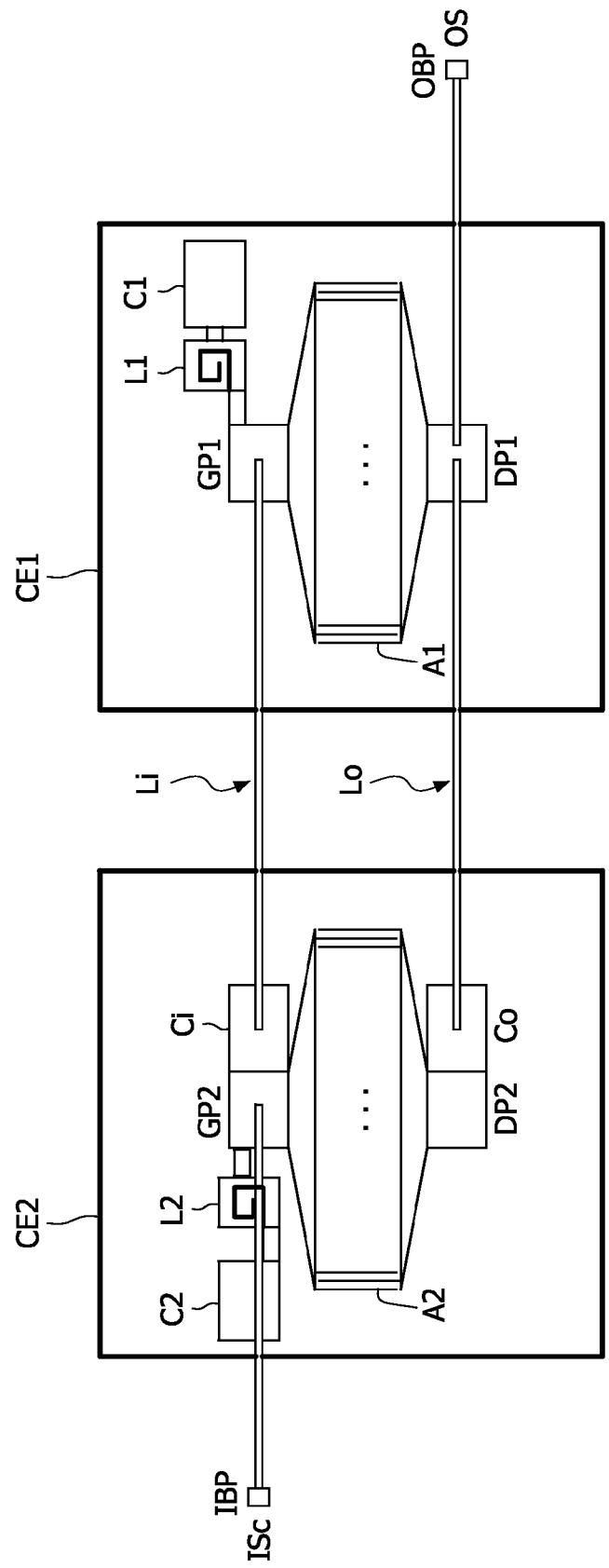
Figure 11:
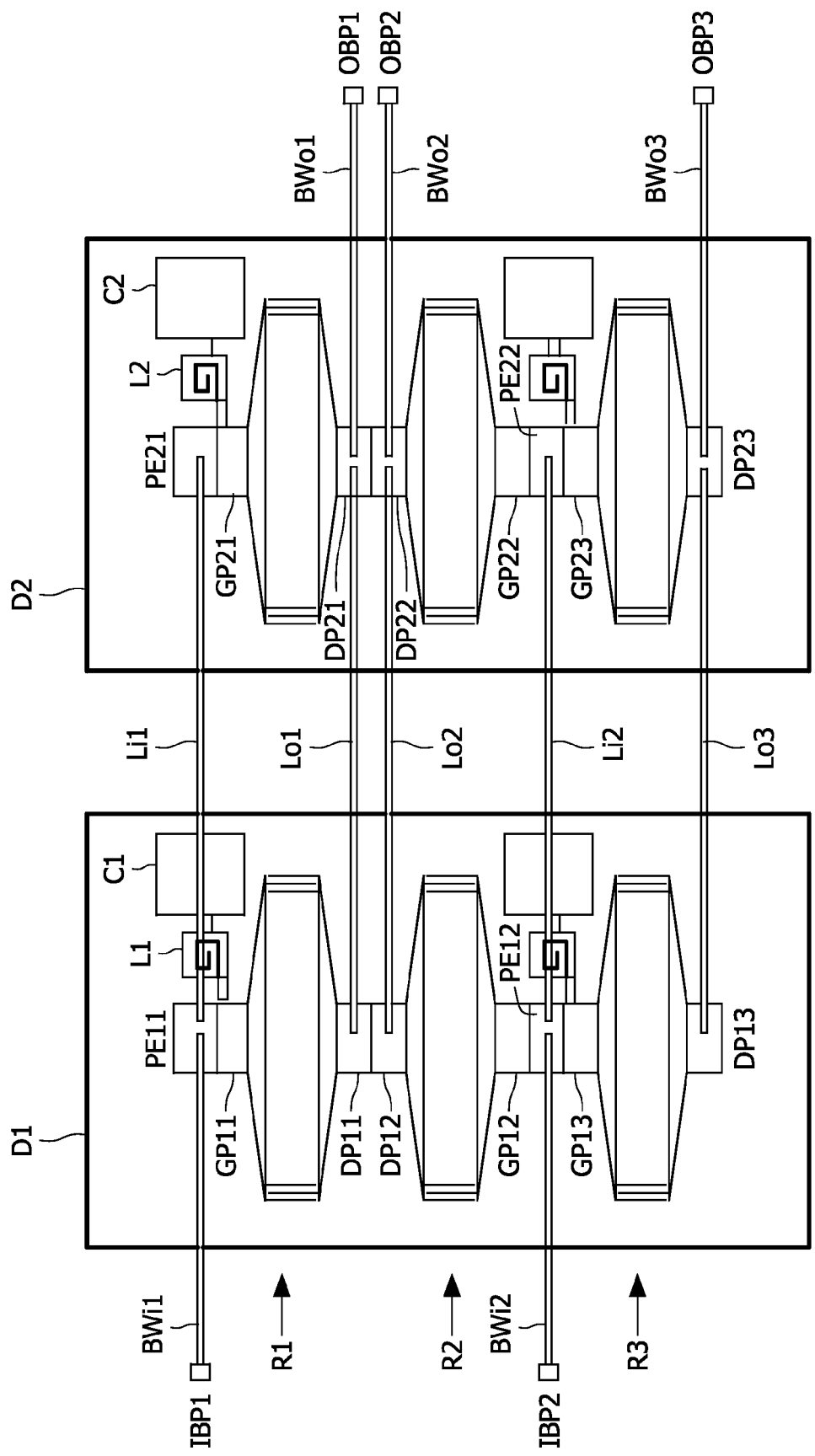
Figure 12:
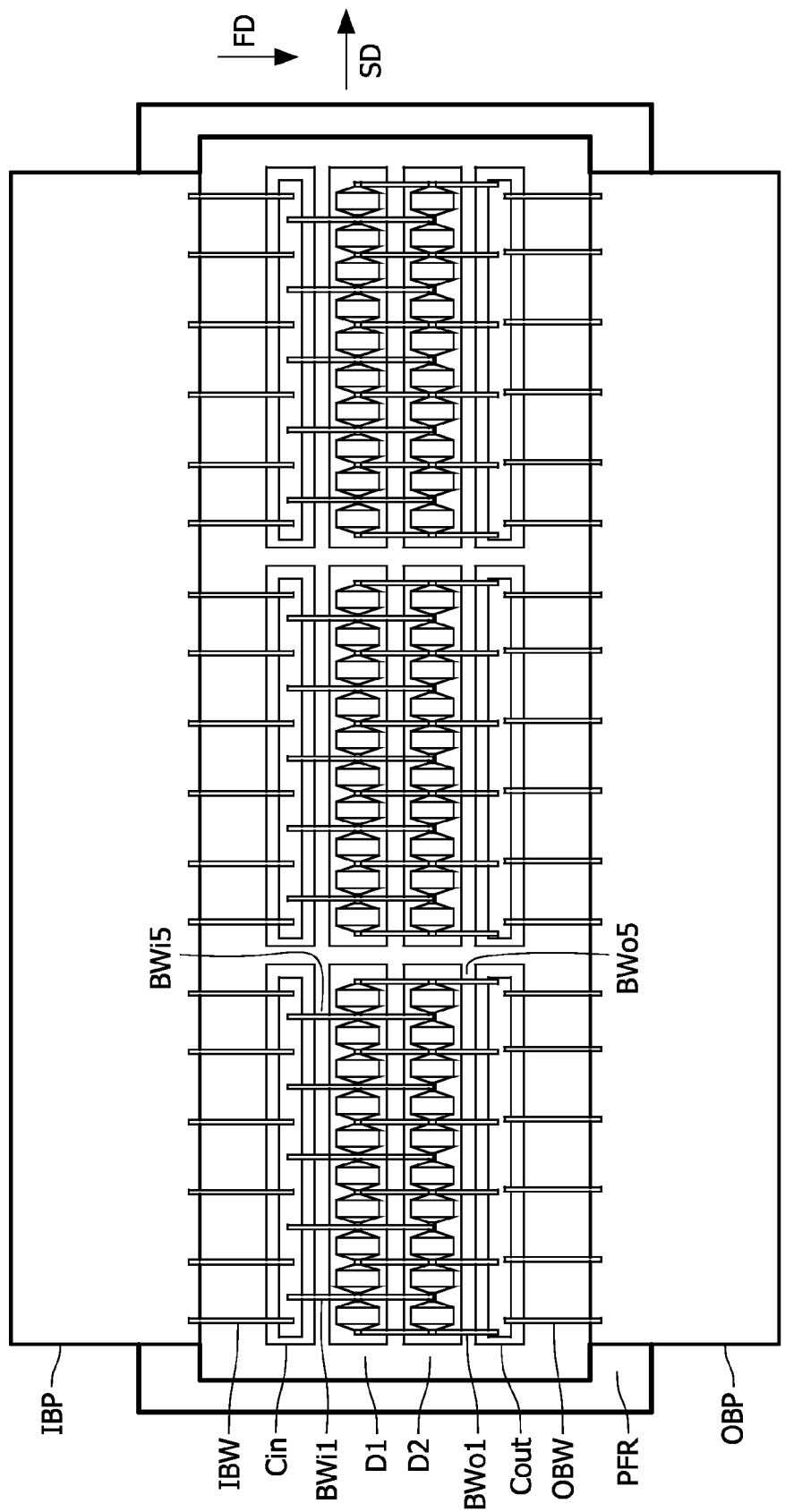
Figure 13:
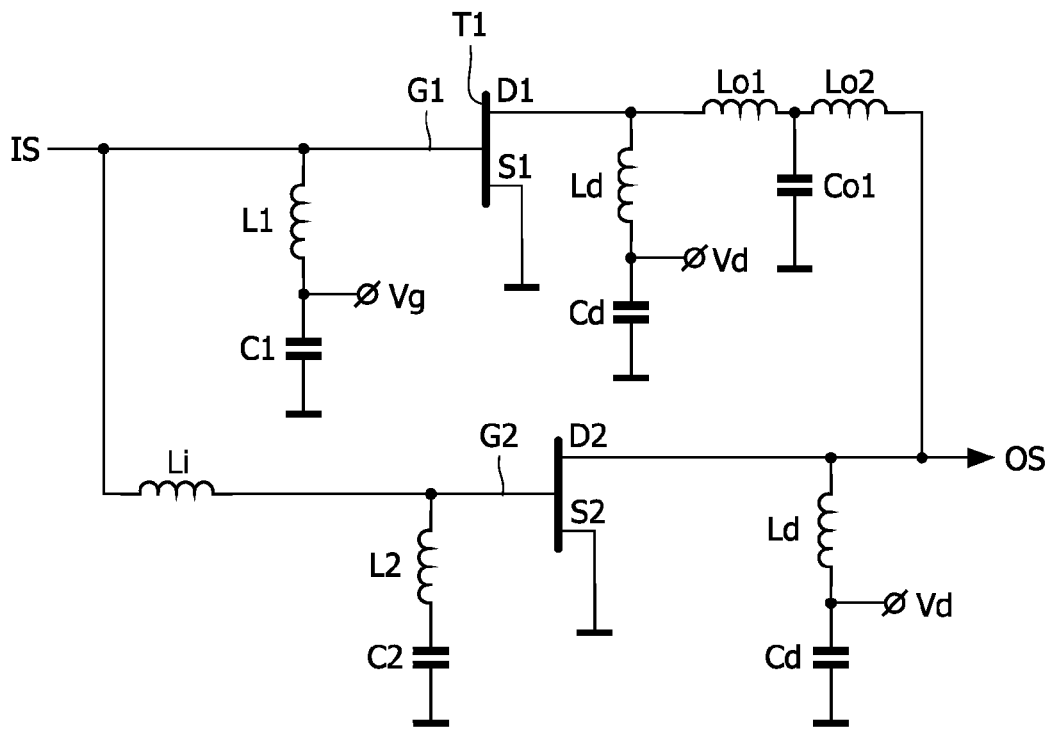
Figure 14:
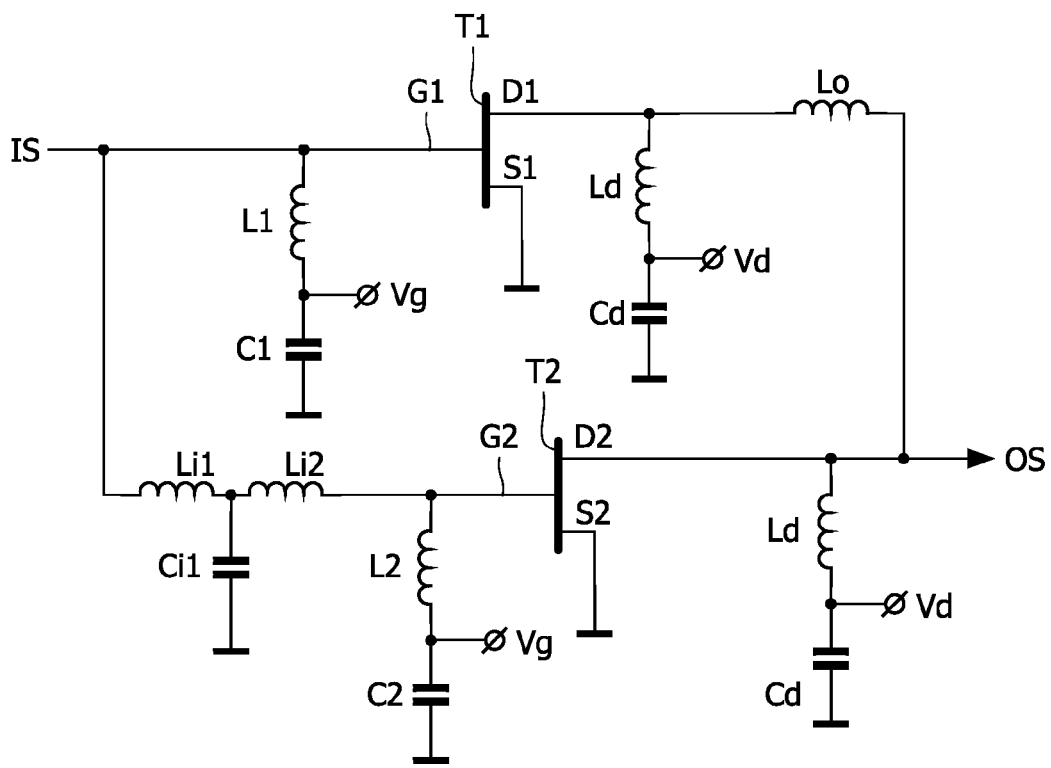

FIG. 2 schematically shows a prior art structure of an RF-amplifier comprising a plurality of cells of which the circuit diagram is shown FIG. 1 and which are arranged in a SOT502 package, FIG. 3 shows a block diagram of two interconnected amplifiers in accordance with an embodiment of the present invention, FIGS. 4A and 4B show a circuit diagram of two different lumped element phase shift circuits, FIG. 5 shows a circuit diagram of two cells which each comprises a single FET and phase shift circuits of which the lumped elements are inductors, FIG. 6 shows a circuit diagram of the two interconnected amplifier cells which each comprises a single FET and the circuits which partially compensate for the parasitic capacitances of the FET, FIG. 7 shows a circuit diagram for three possible embodiments of the two interconnected amplifier cells and the phase shift circuits, FIG. 8 shows a layout of the elements of two adjacent amplifier cells, FIG. 9 shows an alternative layout of the elements of two adjacent amplifier cells, FIG. 10 shows yet another layout of the elements of two adjacent amplifier cells, FIG. 11 schematically shows a layout of three rows of adjacent amplifier cells, FIG. 12 schematically shows a package comprising two columns of amplifier cells, wherein each row comprises two interconnected amplifier cells, FIG. 13 shows an alternative circuit diagram of interconnected amplifier cells, and FIG. 14 shows yet an alternative circuit diagram of interconnected amplifier cells.

It should be noted that items, which have the same reference numbers in different Figures, have the same structural features and the same functions, or are the same signals. Where the function and/or structure of such an item has been explained, there is no necessity for repeated explanation thereof in the detailed description.

FIG. 1 shows a circuit diagram of a cell of the prior art RF-amplifier of FIG. 2. The basic cell has an input to receive an input signal IS and on output to supply an output signal OS. A FET F1 has a gate G connected to the input via a series arrangement of two inductors Lg1 and Lg2 of a pre-match circuit PRMC, a drain D connected to the output via an inductor Ld, and a source S connected to a reference level, which by way of example is ground. A post-match circuit POMC is connected between the drain D and the reference level. The pre-match circuit PRMC further comprises a capacitor Cp connected between a junction of the inductors Lg1 and Lg2 and the reference level. The post-match circuit POMC comprises a series arrangement of an inductor Lpo and a capacitor Cpo. The pre- and post match circuits optimally match the input and output impedance of the basic amplifier cell. A plurality of these cells is arranged in parallel to enable a high total output power.

FIG. 2 schematically shows a prior art structure of an RF amplifier comprising a plurality of cells in accordance with the circuit diagram shown in FIG. 1. The cells are arranged in a SOT502 package. The package frame PFR surrounds the three active dies AD. Each of the active dies AD comprises a particular number of FET amplifier cells. The input signal IS is received at the gate flap GA. The inductors Lg2 are formed by bond wires, which extend between the gate flap GA and the capacitor area Cp. The inductors Lg1 are formed by bond wires, which extend between the active dies and the capacitor area Cp. It has to be noted that the number of bond wires Lg2 and Lg1 has to be selected sufficiently high to prevent the RF-current value flowing there through to destroying these bond wires. The output signal is present at the drain flap DR. The inductors Ld are formed by the bond wires between the active dies AD and the drain flap DR. The inductors Lpo are formed by the bond wires between the active dies and the capacitor area Cpo.

FIG. 3 shows a schematic block diagram of two interconnected amplifiers in accordance with an embodiment of the present invention. The two interconnected amplifier structure comprises two amplifying stages, which in the example shown are the FETs T1 and T2. The FET T1 has a gate G1 connected to the input to receive the input signal IS, a drain D1 coupled to the output to supply the output signal OS via a phase shift circuit PS2, and a source S1 connected to ground. The FET T2 has a gate G2 connected to the input via a phase shift circuit PS1, a drain D2 connected to the output, and a source S2 connected to ground. Both phase shift circuits PS1 and PS2 provide a phase shift θ. Because the phase shift of the phase shift circuits PS1 and PS2 is equal, the contributions of both FETs T1 and T2 to the output signal OS are in phase. It has to be noted that the elements shown in the block diagram are referred to as a basic structure because this structure repeats a plurality of times to be able to obtain a sufficient high output power. The cells referred to in the claims comprise the transistors T1 and T2. It has to be noted that these cells may comprise capacitive or lumped elements, which form part of the phase shifters PS1 and PS2. For example the input and output capacitance of the cells may have to be taken into account when designing the lumped elements of the phase shifters PS1 and PS2. Thus the phase shifters PS1 and PS2 are only schematically shown to be lumped elements. Or said differently, in FIG. 3, the transistors T1 and T2 may be interpreted to be ideal transistors of which the parasitic capacitances are present in the phase shifters PS1 and PS2.

In the prior art, the power capability cannot be increased further because both the maximal finger length and the minimal distance between adjacent fingers are already at the limits of what is possible. Also from the layout shown in FIG. 2 it can be seen that it is extremely difficult to provide an extra set of three active dies in the same package in such a manner that still all active devices have an equal phase and amplitude of the signals at the input and at the output. A longer bond wire at the input results in a shorter bond wire at the output and thus destroys both the impedance required for matching and the equal phase shift. Only the very impractical solution, which requires active dies mounted on top of the active dies shown would fit the equal phase requirement. As will be shown in the layouts of FIGS. 8 to 10, in accordance with the present invention, a special construction of the cells and a special orientation of the cells and the bond wires solve this problem. With cells is meant a basic topology on the active die, which comprises an amplifier construction and may comprise lumped elements integrated on the chip. Usually the amplifier construction is a single FET.

FIGS. 4A and 4B show a circuit diagram of two different lumped element phase shift circuits. Both circuits have a characteristic impedance Zo and generate a phase shift θ. The phase shift circuit shown in FIG. 4A comprises an inductor L arranged between the input and the output of the phase shift circuit, a capacitor C connected between the input and ground, and a capacitor connected between the output and ground. The phase shift circuit shown in FIG. 4B has a series arrangement of two inductors L between the input and the output, and a capacitor C connected between the junction of the two inductors L and ground.

For a phase shift of 90 degrees, the capacitor values C and the inductor values L are defined by $$C = \frac{1}{\omega Zo}$$
$$L = \frac{Zo}{\omega}$$

wherein $\omega = 2\pi fo$

FIG. 5 shows an amplifier circuit diagram comprising two FETs which are combined at the input and output by phase shift circuits comprising the input and output capacitors Cgs1, Cgs2 and Cds1, Cds2 and the lumped element inductors Li, Lo. FIG. 5 shows the two interconnected amplifiers of FIG. 3 wherein the FETs are substituted by their replacement circuits and wherein the phase shift circuits of FIG. 4A are implemented.

The input of the FET T1 is modeled by a gate resistor Rg1 in series with a gate-source capacitance Cgs1. The output of the FET T1 is modeled by a parallel arrangement of a conductivity gm1 and a drain-source capacitance Cds1. The input of the FET T2 is modeled by a gate resistor Rg2 in series with a gate-source capacitance Cgs2. The output of the FET T2 is modeled by a parallel arrangement of a conductivity gm2 and a drain-source capacitance Cds2.

The input phase shift circuit PS1 is formed by the inductor Li and the gate-source capacitances Cgs1 and Cgs2. The output phase shift circuit PS2 is formed by the inductor Lo and the drain-source capacitances Cds1, Cds2. The phase shift θ is obtained both across the inductor Li and the inductor Lo. In this embodiment, the first network N1 only comprises the inductor Li which is the first interconnecting means, and the second network N2 only comprises the inductor Lo which his the second interconnecting means.

However, due to the very low input impedance and high quality factor of FETs this arrangement is difficult to realize.

FIG. 6 shows a circuit diagram of the two interconnected amplifier cells which each comprises a single FET, and the circuits, which partially compensate for the parasitic capacitances of the FETs. FIG. 6 is based on FIG. 5 wherein the transistors T1 and T2 are no longer represented by their replacement circuits, and wherein an inductor L1 is arranged between the gate G1 and ground and an inductor L2 is arranged between the gate G2 and ground. The capacitors C1, C2 in series with the inductors L1, L2, respectively, are optional.

Let it first be assumed that the capacitors C1, C2 are not present. The inductors L1, L2 provide partial compensation of the parasitic input capacitances Cgs1 and Cgs2. Due to the partial compensation the equivalent input impedance of the FETs is increased, and the quality factor of the input impedance is decreased to desirable value, which preferably is 1. The partial compensation enables to design a positive or negative imaginary part of the input impedance depending on the selected value of the inductors L1, L2. Thus, a high flexibility is obtained to design the input impedance as required.

The optional capacitors C1, C2 are DC-decoupling capacitors, which provide a RF-ground for the inductors L1, L2. DC gate bias voltages Vg are supplied to the junctions of the inductors L1, L2 and the capacitors C1, C2. The application of the gate bias voltages at these junctions has the advantage that the gate bias voltage source is decoupled over a large frequency range, for example up to 100 MHz.

In the same manner the inductors Ld may be connected to the drains D1, D2 of the FETs T1, T2 to partially compensate for the parasitic capacitances Cd. The DC-decoupling capacitors Cd may be added to supply the DC drain bias voltage Vd via the inductors Ld to the drains D1, D2. Again, the capacitors Cd and Cd provide an RF ground for the inductors Ld.

FIG. 7 shows a circuit diagram for three possible embodiments of the two interconnected amplifier cells and the phase shift circuit at the input. FIG. 7 is based on FIG. 6 to which a capacitor Ci in series with the inductor Li has been added. The series arrangements of the inductors Ld and the capacitors Cd are not shown. This Figure shows three options to apply the input signal IS.

In the first option, the input signal IS is supplied as the signal ISa to the gate G1 of the FET T1, and via the series arrangement of the capacitor Ci and the inductor Li to the gate G2 of the FET T2. In the second option, the input signal IS is supplied as the signal ISb to the junction of the capacitor Ci and the inductor Li. In the third option, the input signal IS is supplied as the signal ISc to the gate G2. In all these embodiments, the first network N1 comprises the series arrangement of the capacitor Ci and the inductor Li.

In a practical implementation one of these options will be selected depending on, for example, the frequency of operation, the requirements defined by the implementation in the total design, a desirable frequency response of the input impedance, and/or the required control over the phase shift.

Optionally, a capacitor Co may be arranged in series with the inductor Lo. Preferably, this capacitor is arranged close to the drain pad DP2. The capacitor Co provides more flexibility to tune the frequency response or to compensate for a too high inductance of the inductor Lo.

FIG. 8 shows a layout of the elements of two adjacent amplifier cells corresponding to the circuit diagram shown in FIG. 6 but without the series arrangements of the inductors Ld and the capacitors Cd.

The cell CE1 comprises the transistor T1, which is shown to have an input pad GP1 which is connected to the gate G1 fingers in the active area A1 of the transistor T1. The transistor T1 has an output pad DP1, which is connected to the drain fingers in the active area A1 of the transistor T1. The source S1 of the transistor T1 is connected via an n-well, which is arranged below the finger structure (not shown). The cell CE1 further comprises the series arrangement of the capacitor C1 and the inductor L1 connected between the gate pad GP1 and ground.

The cell CE2 comprises the transistor T2, which is shown to have an input pad GP2 which is connected to the gate G2 fingers in the active area A2 of the transistor T2. The transistor T2 has an output pad DP2, which is connected to the drain fingers in the active area A2 of the transistor T2. The source S2 of the transistor T2 is connected via an n-well, which is arranged below the finger structure (not shown). The cell CE2 further comprises the series arrangement of the capacitor C2 and the inductor L2 connected between the gate pad GP2 and ground.

The input signal IS present at the input bond pad IBP is supplied to the gate pad GP1 via a bond wire BWi. The gate pads GP1 and GP2 are interconnected by the bond wire BW1, which forms the inductor Li. The drain pads DP1 and DP2 are interconnected by the bond wire BW2, which forms the inductor Lo. The bond wire BWo connects the drain pad DP2 with the output bond pad OBP to supply the output signal OS.

The input bond pad IBP, the interconnected cells CE1 and CE2, and the output bond pad OBP, are displaced in a first direction FD. The active areas A1, A2 of the amplifiers are arranged in-between input pads GP1, GP2 and output pads DP1, DP2, and the input pads GP1, GP2, the active areas A1, A2, and the output pads DP1, DP2 are displaced in a second direction SD which is substantially perpendicular to the first direction FD. Due to this special layout, it is possible to interconnect the input pads GP1, GP2, and to interconnect the output pads DP1, DP2 by parallel arranged interconnections BW1, BW2 which have an inductance Li, Lo selected to obtain the same phase shifts. Preferably, as shown, the interconnections BW1 and BW2 are bond wires, which have a suitably selected height above the surface of the chip on which the other components (A1, A2, GP1, GP2, DP1, DP2, L1, C1, L2, C2) are integrated.

The layout shown is very advantageous in a practical implementation because the electro-magnetic coupling between the bond wires is minimal. The coupling between the bond wires BW1, BW2 with BWi or BWo is minimal because there is no or a minimal area wherein they run in parallel. The coupling between the bond wires BW1 and BW2 can be minimized by selecting a different height above the surface of the chip. These different heights are usually required because a same delay should be obtained while the parasitic input and output capacitances of the FETs T1 and T2 differ.

FIG. 9 shows an alternative layout of the elements of two adjacent amplifier cells. The only differences with respect to the layout shown in FIG. 8 are that now the capacitor Ci of FIG. 7 has been added in the cell CE1 with one terminal connected to the gate pad GP1, and that both the input bond wire BWi and the bond wire Li are connected to the other terminal of the capacitor Ci instead of to the input pad GP1. Thus, this layout corresponds to option 2 of FIG. 7 wherein the input signal IS is the signal ISb.

FIG. 10 shows yet another layout of the elements of two adjacent amplifier cells. One of the differences with respect to the layout shown in FIG. 9 is that the input bond wire BWi is connected to the gate pad GP2 instead to the capacitor Ci. Another difference is that the capacitor Co (see also FIG. 7) is added to the second cell CE2 with one terminal connected to the drain pad DP2 and the other terminal to the inductor Lo which preferably is formed by a bond wire.

FIG. 11 schematically shows a layout of three rows of adjacent amplifier cells. In the example shown, the three rows R1, R2, R3 extend in a first direction and each comprise one of the amplifier cells shown in FIG. 8, or FIG. 9, or FIG. 10. In the embodiment shown in FIG. 11, the rows R1 and R3 have the same layout as shown in FIG. 8. The same items in row R1 have the same references as in FIG. 8. These cells are combined with each other in a second direction at one side with gate pads GP12, GP13 and GP22, GP23, and at the other side with drain pads DP11, DP12 and DP21, DP22. In this manner a compact structure of the high power device is created which provides a very uniform phase and amplitude distribution of the signal at the input and at the output of the all included amplifier cells. More than three rows and/or more than two columns may be present.

The row R2 of interconnected amplifier cells is identical to the row R1 but is now positioned upside down such that the output pads DP11, DP21 of the transistors of the first row and the output pads DP12, DP22 of the transistors of the second row are directly opposing each other, or are even directly contacting each other. The output pads DP12 and DP22 are interconnected by a bond wire, which forms an inductance Lo2. The output pad DP22 is connected by a bond wire BWo2 to the output pad OBP2.

The row R3 of interconnected amplifier cells is identical to the row R1. The input bond pad IBP2 is connected by the bond wire BWi2 to the extra pad PE12 which contacts both the input pad GP12 of the first transistor of the second row R2 and the input pad GP13 of the first transistor of the third row R3. The bond wire interconnecting the extra pads PE12 and PE22 forms the inductance Li1. The output pads DP13, DP23 of the transistors of the third row R3 are interconnected by a bond wire, which forms the inductance Lo3. The output pad BP23 is connected to the output bond pad OBP3 via a bond wire BWo3.

Preferably, the first column of cells is arranged on a first die D1 and the second column of cells is arranged on a second die D2. Although it is possible to arrange all the cells on the same die this would result in a much larger total area of the dies while the area in-between the two columns of cells where the bond wires connect the transistors is not used. Although, if the length of the bond wires is limited, the area between the dies can be used by capacitor Co1 or Ci1 if the phase shift circuit of type 2 is used (see FIG. 4b) as is presented in FIG. 13 and FIG. 14.

FIG. 12 schematically shows a package comprising two columns of amplifier cells, wherein each row comprises two interconnected amplifier cells. The standard SOT502 package comprises a frame PFR, an input bond flap IBP, an output bond flap OBP, and three groups of interconnected amplifier cells.

Each group of interconnected amplifier cells comprises in input capacitor Cin which is connected to the input bond flap IBP via the bond wires IBW and which is connected to the first die D1 via the bond wires BWi1 to BWi5. The first die D1 may have the same structure as that shown in FIG. 11, but instead of 3 now 10 combined amplifier cells are present at die D1. The second die D2, which may have the same structure as that shown in FIG. 11, but which comprises 10 instead of 3 transistors, has outputs, which are connected via the bond wires BWo1 to BWo5 to an output capacitor Cout. The interconnections between the first die D1 and the second die D2 may be made by bond wires in the same manner is shown in FIGS. 8 to 10 to obtain the inductances Li and Lo. The bond wires OBW connect the output capacitor to the output bond flap OBP.

As is clear from FIG. 12, the input bond flap IBP, the first amplifier cells D1, the second amplifier cells D2 and the output bond flap OBP occur in the sequence mentioned in the first direction FD. The transistor structures comprise an input pad, an active area which comprises the finger structure, and the output pad which occurs in the sequence mentioned in the second direction SD which is substantially perpendicular to the first direction, such as, for example is disclosed with respect to FIGS. 8 to 11. It is further clear from FIG. 12 when compared to FIG. 2 that the area within the package which is occupied by active dies is much larger. Consequently, the maximum output power of the amplifier in the package is much higher.

FIG. 13 shows an alternative circuit diagram of interconnected amplifier cells. The circuit shown in FIG. 13 is the circuit shown in FIG. 6 in which the output inductor Lo is replaced by a series arrangement of two inductors Lo1 and Lo2 and a capacitor Co1. The series arrangement of the two inductors Lo1 and Lo2 is arranged between the drains D1 and D2, and the capacitor Co1 is arranged between the junction of the two inductors Lo1 and Lo2 and ground. This circuit comprises a phase shift network at the input as shown in FIG. 4A. This input phase shift circuit comprises the inductor Li and the input capacitance of the amplifiers formed by the transistors T1 and T2. The circuit further comprises a phase shift network Lo1, Lo2, Co1 at the output as shown in FIG. 4B.

FIG. 14 shows yet an alternative circuit diagram of interconnected amplifier cells. The circuit shown in FIG. 14 is the circuit shown in FIG. 6 in which the input inductor Li is replaced by a series arrangement of two inductors Li1 and Li2 and a capacitor Ci1. The series arrangement of the two inductors Li1 and Li2 is arranged between the gates G1 and G2, and the capacitor Ci1 is arranged between the junction of the two inductors Li1 and Li2 and ground. This circuit comprises a phase shift network comprising the inductor Lo and capacitor Co at the output as shown in FIG. 4A, and a phase shift network Li1, Li2, Ci1 at the input as shown in FIG. 4B.

In short, the amplifier structure of the invention has a larger bandwidth and a high power capability per unit area. It is suitably implemented with a Doherty design, so that good linearity is achieved. It has been found in particular that the structure of the invention allows design with bandwidths of more than 100 MHz. Even a bandwidth of 400 MHz is achievable, which is extremely broad within the relevant field of RF amplifier structures. This implies that the commercially important frequency bands of PCS (1800 MHz) and WCDMA (up to 2200 MHz) can be covered by a single amplifier structure.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. An integrated HF-amplifier structure comprises:
   in a first direction in the order mentioned: an input bond pad, a plurality of cells being displaced with respect to each other in the first direction, and an output bond pad, each one of the cells comprises an amplifier having an input pad, an active area, and an output pad, the active area being arranged in-between the input pad and the output pad, and wherein the input pad, the active area, and the output pad are displaced with respect to each other in a second direction substantially perpendicular to the first direction,
   a first network comprising first interconnecting means for interconnecting input pads of adjacent ones of the plurality of cells, and extending in the first direction, and
   a second network comprising second interconnecting means for interconnecting output pads of adjacent ones of the plurality of cells, and extending in the first direction,
   wherein the first network and the second network are constructed for obtaining an output signal at the output bond pad having for all the interconnected cells an equal phase shift and amplitude for a same input signal at the input bond pad.

2. An integrated amplifier structure as claimed in claim 1, wherein the first interconnecting means comprises a first bond wire extending in the first direction, and the second interconnecting means comprises a second bond wire also extending in the first direction.

3. An integrated amplifier structure as claimed in claim 2, wherein the first bond wire forms a first inductance, and wherein the second bond wire forms a second inductance.

4. An integrated amplifier structure as claimed in claim 1, wherein each one of the amplifier cells is arranged on a separate die.

5. An integrated amplifier structure as claimed in claim 1, wherein an impedance of the first network and the second network is selected to obtain impedance matching.

6. An integrated amplifier structure as claimed in claim 2, wherein the first on wire directly interconnects input pads of the adjacent amplifier cells.

7. An integrated amplifier structure as claimed in claim 2, wherein the second bond wire directly interconnects output pads of the adjacent amplifier cells.

8. An integrated amplifier structure as claimed in claim 2, wherein the first network further comprises a capacitor arranged in series with the first bond wire, the series arrangement being arranged between the input pads, and wherein the input signal is supplied to one of the input pads.

9. An integrated amplifier structure as claimed in claim 2, wherein the first network further comprises a capacitor arranged in series with the first bond wire, the series arrangement being arranged between the input pads, the capacitor being arranged for supplying the input signal via the capacitor to the input pads.

10. An integrated amplifier structure as claimed in claim 6, further comprising a first and a second series arrangement of an inductor and an DC-decoupling capacitor connected to each one of the input pads, respectively.

11. An integrated amplifier structure as claimed in claim 6, further comprising a third and a fourth series arrangement of an inductor and an DC-decoupling capacitor connected to each one of the output pads, respectively.

12. An integrated amplifier structure as claimed in claim 6, where inductors are made of bond wires or are integrated.

13. An integrated amplifier structure as claimed in claim 1, wherein at each position in the first direction, the cell is replaced by a row of amplifier cells to obtain in the order mentioned in the second direction: a row of input bond pads, a plurality of rows of cells being displaced with respect to each other in the first direction, and a row of output bond pads, wherein all the rows are arranged in parallel with each other.

14. An integrated circuit comprising an integrated amplifier structure as claimed in claim 1.

15. An integrated circuit as claimed in claim 14, wherein the plurality of cells comprises a first cell and a second cell, and wherein the first network and the second network are constructed for obtaining a phase shift of +90° or −90° at a particular operational frequency, and wherein the amplifier of the second cell is arranged for operating in class B or C, thereby providing a Doherty Amplifier.

* * * * *